United States Patent [19]
Britton

[11] Patent Number: 5,590,104
[45] Date of Patent: Dec. 31, 1996

[54] METHOD OF PEDESTAL AND COMMON-MODE NOISE CORRECTION FOR SWITCHED-CAPACITOR ANALOG MEMORIES

[75] Inventor: Charles L. Britton, Alcoa, Tenn.

[73] Assignee: Martin Marietta Energy Systems, Inc., Oak Ridge, Tenn.

[21] Appl. No.: 316,193

[22] Filed: Sep. 30, 1994

[51] Int. Cl.⁶ .................................................. G11C 27/00
[52] U.S. Cl. .............................. 365/45; 365/149; 365/206
[58] Field of Search .............................. 365/45, 149, 206, 365/207

[56] References Cited

U.S. PATENT DOCUMENTS 5,388,064  2/1995  Khan ........................................ 365/45

Primary Examiner—David C. Nelms
Assistant Examiner—Huan Hoang
Attorney, Agent, or Firm—J. M. Spicer; H. W. Adams

[57] ABSTRACT

A method and apparatus for correcting common-mode noise and pedestal noise in a multichannel array of switched-capacitor analog memories wherein each analog memory is connected to an associated analog-to-digital converter. The apparatus comprises a single differential element in two different embodiments. In a first embodiment, the differential element is a reference analog memory connected to a buffer. In the second embodiment, the differential element is a reference analog memory connected to a reference analog-to-digital connected to an array of digital summing circuits.

3 Claims, 4 Drawing Sheets

METHOD OF PEDESTAL AND COMMON-MODE NOISE CORRECTION FOR SWITCHED-CAPACITOR ANALOG MEMORIES

GOVERNMENT RIGHTS STATEMENT

This invention was made with Government support under contract DE-AC05-84OR21400 awarded by the U.S. Department of Energy to Martin Marietta Energy Systems, Inc., and the Government has certain rights in the invention.

FIELD OF THE INVENTION

The present invention relates to multichannel switched-capacitor analog memory arrays, and more particularly to a new implementation of differential correction for reducing pedestal error and common-mode noise.

BACKGROUND OF THE INVENTION

Almost all of the applications of analog memories to date have been in high energy physics colliders. In these applications, large arrays of analog memories are embodied in MOS semiconductor electronics, and comprise part of the front-end electronics for the collider detectors.

A switched-capacitor analog memory (SCAM), or switched-capacitor storage array, is an array of cells in which analog samples from a single input channel can be stored at successive time intervals. Each cell of the SCAM comprises a single capacitor and a switch. The storage cells are individually addressable during write and read operations by control logic which provides a pointer to activate a particular cell switch at the appropriate time.

An analog-to-digital converter (ADC) is usually connected to the analog memory to change the analog output to digital form. Each ADC has two inputs, the signal input which connects to the SCAM, and the reference input, to which a fixed known reference voltage or current such as an error correction or other offset is applied. In operation, the ADCs carry out their conversion based on the value of the reference level they receive.

A high energy physics collider such as the Relativistic Heavy Ion Collider (RHIC) uses thousands of detector channels to capture data at successive 110 nanosecond time intervals. Large arrays of switched-capacitor analog memories may be chosen as part of the large data acquisition system for RHIC. A general representation of a SCAM array is shown in FIG. 1. In FIG. 1, the array 11 comprises multiple channels 12 of switched-capacitor analog memories 14, 15, etc. FIG. 1 also depicts at 13 an array comprising an equal number of analog-to-digital converters 16, 17, etc., connected to the analog memory channels in the standard way.

In FIG. 1, analog inputs from the signal sources (detector preamplifiers in the example of RHIC) are input on respective SCAM 14, 15, etc., signal input leads 18, 19, etc. Control logic (not shown) to each SCAM 14, 15 etc., causes those cells 28 that are in the first column (column 26) to capture (store) the instantaneous values of all the respective input signals at a time, say $t_0$. At increasing time $t_1$, about 110 nanoseconds later, the control logic causes those cells 28 that are in column 27 to store the instantaneous updated values of all the input signals. This sampling repeats continuously at times $t_2$, $t_3$, etc., until the last column of cells in the SCAMs 14, 15, etc., are filled. At that time, the control logic repeats, causing the multichannel analog memory 12 to write the new instantaneous values of the analog signals in the column 26 cells, etc., the data sampling process repeating endlessly.

The multichannel analog memory 12 thus acts as a circular buffer, continuously storing the latest values of the signal information from all the signal sources or detectors. As is well known, all of the sampled values in a column 26, 27, etc., are time-correlated since they are all taken at the same instant of time, and represent time-sampled values of the analog inputs from the detectors or signal sources.

In the collider example, pedestal noise is any noise that is inherent in the analog memories with no preamplifiers attached to them. Pedestal noise is caused from many things but they are all on-chip. The two most common sources of pedestal noise are the cell-to-cell variations which can be random in nature (and cannot be corrected with the present invention), and systematic sources such as the address lines that select the columns (pattern noise). There is also the inherent noise of the cell itself, but that is typically so low it is unmeasured.

In general, then, the pedestals are on-chip internally-caused noise sources, and common-mode is externally caused from power supply variations or preamplifier pickup.

Differential common-mode cancellation has been widely used for common-mode noise subtraction in electronic apparatus. It has also been applied to individual switched-capacitor analog memories, and it has been proposed for large pipelined SCAM systems. In the known embodiments of differential common-mode cancellation applied to SCAMs, one differential element is always used to correct one SCAM. The usual embodiment is one differential amplifier providing a fixed reference offset voltage, or charge (depending on the application) to the output of one SCAM at readout of that SCAM.

In the standard embodiment of differential common-mode cancellation then, just as many reference channel elements (usually differential amplifiers) are required to provide the correction as there are signal channels. Thus, whether applied to systems with one or multiple SCAMs, all of the known forms of differential common-mode cancellation may be termed fully differential common-mode cancellation. The present invention is an alternate method of doing differential common-mode cancellation that requires fewer differential elements than signal channels. The present invention, therefore, will be understood not as another embodiment of fully differential common-mode cancellation, but rather as a new embodiment of differential common-mode cancellation.

The RHIC is expected to use greater than 300,000 analog memory channels, and the standard fully-differential form of common-mode correction is not desired because, at the rate of one reference channel per data channel, an additional 300,000 channels of electronics would be needed. This would increase the silicon real estate, and add greatly to the cost of the detector instrumentation.

The following references provide further description of analog memories, problems of their use, error correction methods, and collider detector analog memory instrumentation.

1. J. T. Walker et al, "Microstore—The Stanford Analog Memory Unit," IEEE Trans. Nuc. Sci., Vol. NS-32, No. 1, pp. 616–621, Feb. 1985.
2. W. Sippach et al, "Development of the Front End Electronics for the ZEUS High Resolution Calorimeter," IEEE Trans. Nuc. Sci., NS-36, pp. 465–470, Feb. 1989.

3. B. Wadsworth, "Technology-Independent Design Considerations for Switched-Capacitor Analog Memories," M.I.T., Laboratory of Nuclear Science Electronics Facility Technical Note 89-6, June 1989.

4. A. Konstantinidis and B. Wadsworth, "Design Considerations for Switched-Capacitor Analog Memories", Laboratory for Nuclear Science, M.I.T.; 1991 Nuclear Science Symposium and Medical Imaging Conference Record, pp. 606–610, Nov. 2–9, 1991.

SUMMARY OF THE INVENTION

In accordance with a preferred analog embodiment of the present invention, there is provided a method of correcting common-mode noise and pedestal noise in a multichannel array of switched-capacitor analog memories wherein each analog memory is connected to an associated analog-to-digital converter. The method comprises the steps of: dividing the analog memories into groups based on the commonality of their noise source inputs; providing a single differential element for each of the groups of analog memories; generating differential common-mode correction signals in the single differential elements for correcting the noise source inputs of each of the groups of analog memories; and applying the correction signals to the reference inputs of each of the analog-to-digital converters. In this instance, the single differential element is a reference analog memory connected to a buffer, the reference analog memory having the same noise source inputs as the other analog memories in the group.

In accordance with a preferred digital embodiment of the present invention, there is provided a method of correcting common-mode noise and pedestal noise in a multichannel array of switched-capacitor analog memories wherein each analog memory is connected to an associated analog-to-digital converter. The method comprises the steps of: dividing the analog memories into groups based on the commonality of their noise source inputs; providing a single differential element for each of the groups of analog memories; generating differential common-mode correction signals in the single differential elements for correcting the noise source inputs of each of the groups of analog memories; providing digital summing circuits corresponding to each of the analog-to-digital converters, the summing circuits having first and second inputs; connecting the outputs of each of the analog-to-digital converters to the first inputs of the digital summing circuits; and applying the correction signals to the second inputs of the digital summing circuits.

For a better understanding of the present invention, together with further objects, advantages, and capabilities thereof, reference is made to the following disclosure and appended claims in connection with the above-described drawings.

DESCRIPTION OF THE PREFERRED EMBODIMENTS

First Embodiment

Both embodiments of the present invention are based on the discovery that some of the pedestal and common-mode noise sources are the same, or similar, across a group of analog memory channels. Not just one, then, but large numbers of the analog memories are affected to the same, or nearly the same degree. In accordance with this invention, the system designer observes the commonalities of noise influence, i.e., the time-correlated noise, and utilizes one differential element to correct not one analog memory, but groups of analog memories selected from the larger array on the basis of common noise patterns.

In RHIC, for example, the designer may decide to group data channels from detectors whose preamplifiers are spatially correlated, that feed from the same power supply, and that are located in the same general area of the collider. By so grouping the analog memory channels, the noise picked up on the grouped channels will be timecorrelated, and can be corrected using just one differential element per group of analog memories.

Figure 1:
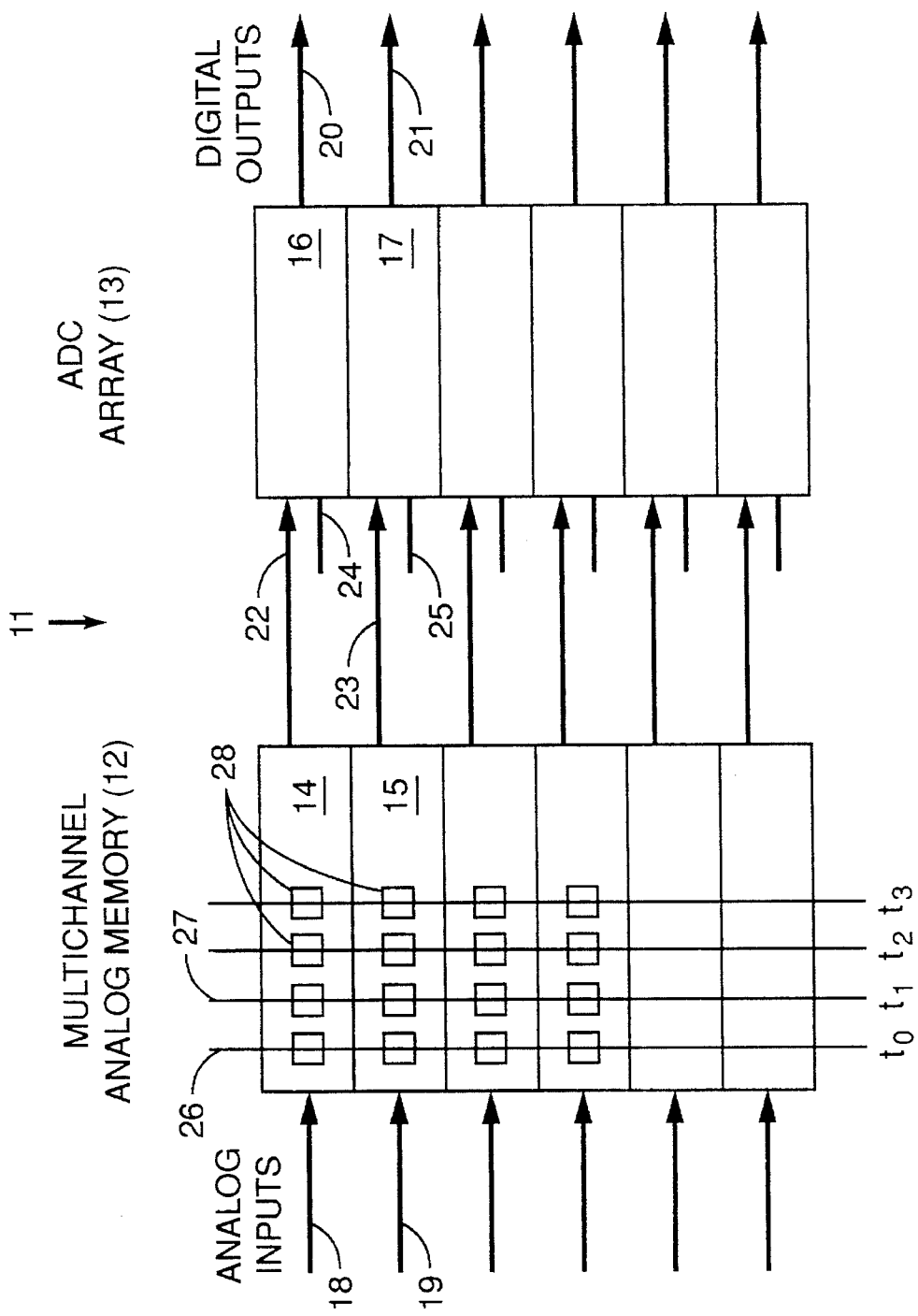
FIG. 1 is a schematic view of a generic switched-capacitor analog memory array.
Figure 2:
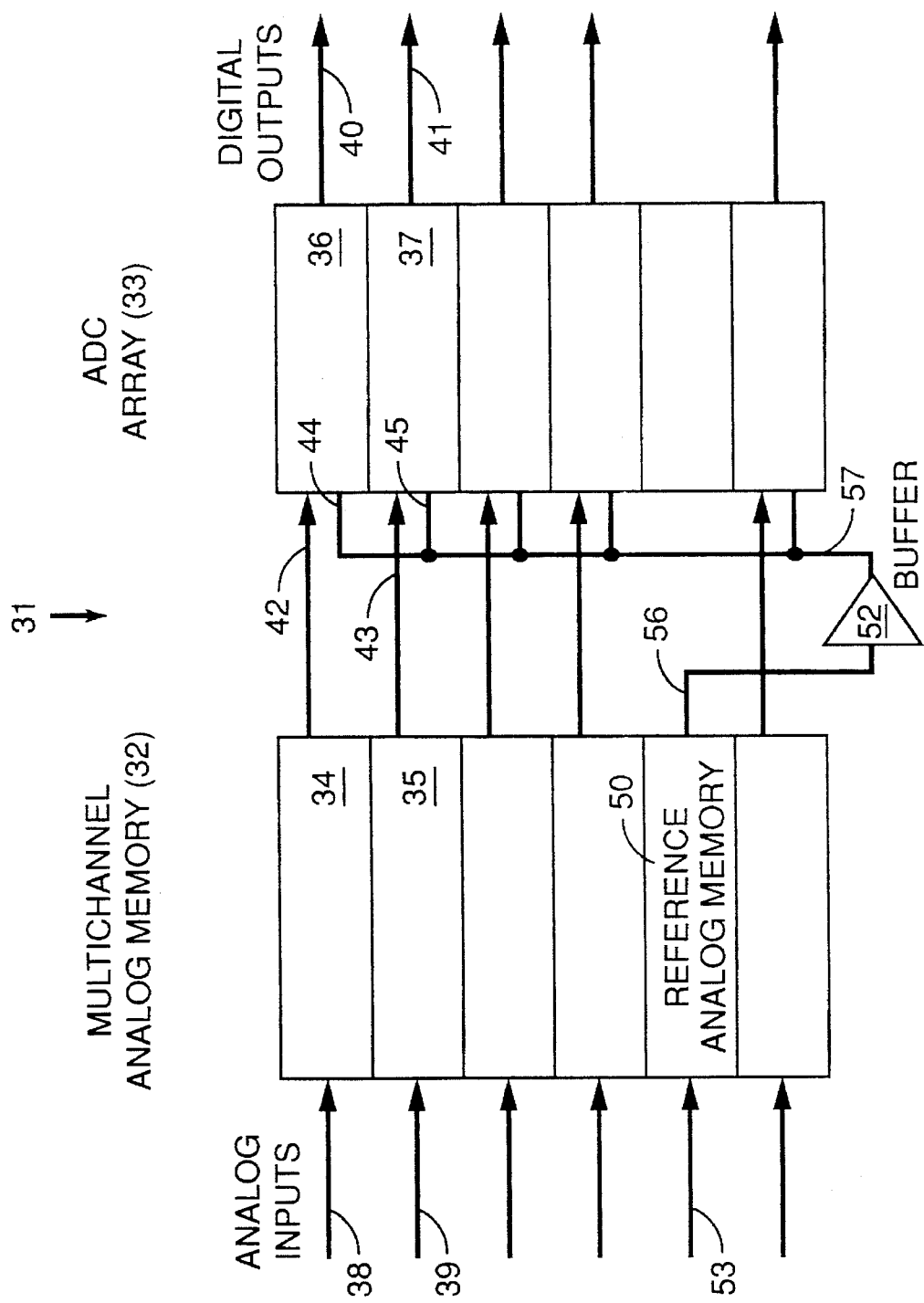
FIG. 2 is a schematic view of a preferred analog embodiment of the present invention, showing the use of one reference buffer as the differential element for a group of switched-capacitor analog memory channels.

FIG. 2 shows a preferred analog embodiment of the present invention. In FIG. 2, the multichannel analog memory 32 and ADC array 33 represent a preselected group of analog memory data channels as described previously. As in FIG. 1, analog signal information from the detector preamplifiers is fed to the analog memory 34, 35, etc., cells through leads 38, 39, etc. The control logic causes the signal information to be written (i.e., stored) in the SCAMs 34, 35, etc., as capacitance values until read out to the ADCs 36, 37 etc. Typically, all of the stored values are read out together and presented in digital form to a bus (not shown) or data acquisition system on output leads 40, 41.

In the practice of the invention, one SCAM 50 from the multichannel analog memory 32 is connected at its signal input 53 to its preamplifier (not shown) in the same manner as all the other SCAMs. However, that preamplifier is not connected to a detector. Rather, the preamplifier picks up common-mode (system) noise whose numerical value is stored by the reference memory 50 in the normal write operation. All of the analog memories, then, store their respective signals plus the external common-mode noise, except that the analog memory 50 stores only the external common-mode noise became it receives but no detector signal. The output of the memory 50 goes to a buffer 52 on lead 56, and the buffer 52 output on lead 57 goes to all the reference inputs 44, 45, etc., of all the ADCs 36, 37, etc. The ADCs subtract the singular reference input from all the signal inputs, causing the digital outputs of all the data channels to be corrected by the same offset.

It needs to be noted that the first embodiment of the present invention works with one specific type ADC, not with general type ADCs. The ADCs need to be of a type in which the reference input affects just the offset of the signal, but not affect the gain of the signal. Wilkinson single slope ADCs have been built with this type of reference input for collider experiments. Standard off-the-shelf ADCs that are referenced to absolute ground will not work with this invention.

Second Embodiment

Figure 3:
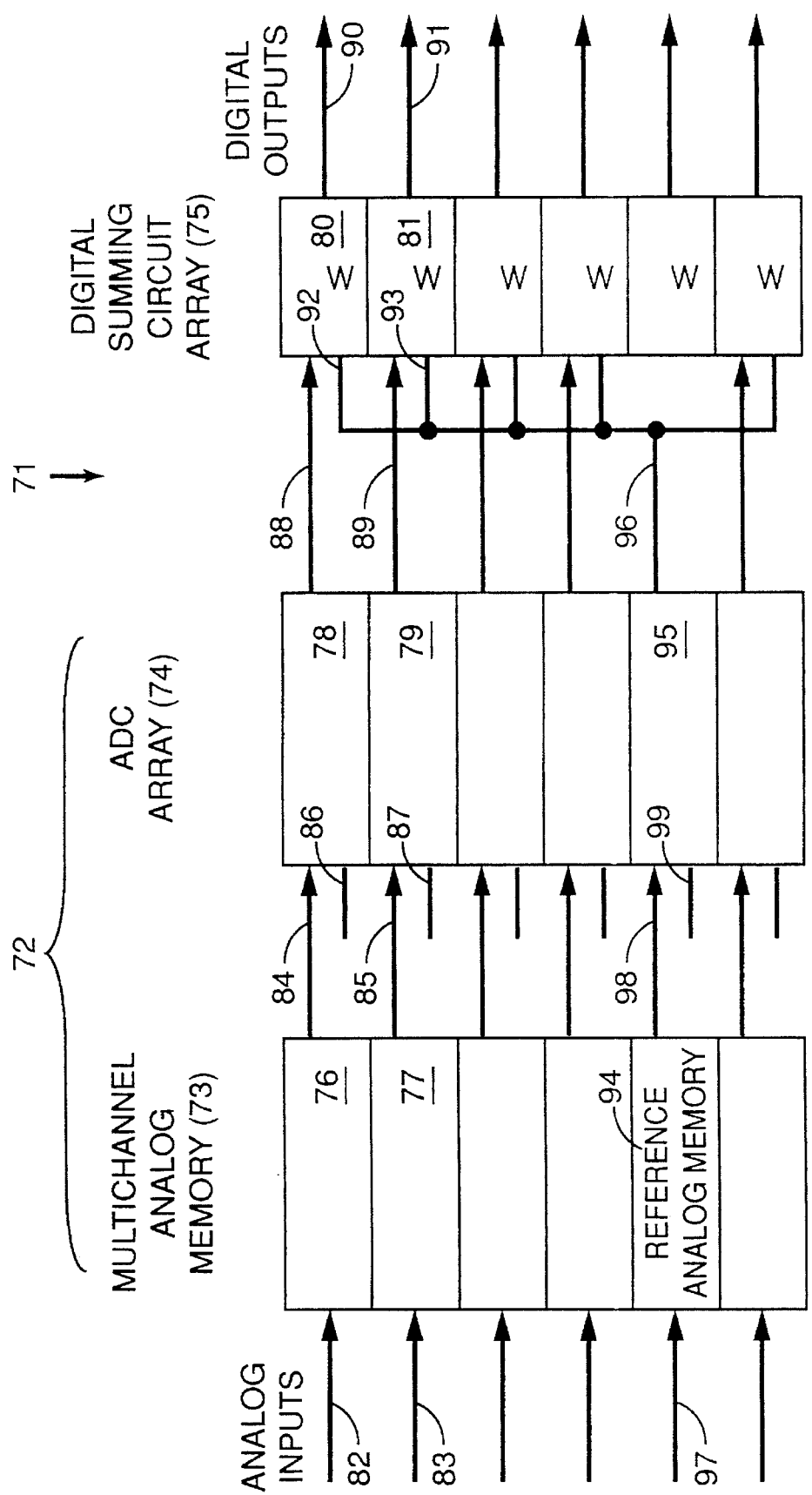
FIG. 3 is a schematic view of a preferred digital embodiment of the present invention, showing the use of one reference analog memory as the differential element for a group of switched-capacitor analog memory channels.

The other preferred embodiment of the present invention is the digital embodiment shown in FIG. 3. In FIG. 3, the signal analog memories 76, 77, etc., are connected to their respective ADCs 78, 79, etc., as in FIGS. 1 and 2, with the exception that the reference analog memory 94 that contains only the system noise (no signal) is connected to a single ADC channel 95, not to all the ADC reference inputs as in FIG. 2.

In the digital embodiment, the ADC references 86, 87, etc., are available and can be connected to any standard reference, either individually or collectively.

The digitized signals from all the channels are on the output leads 88, 89, etc., of the ADCs. Also, the digitized value of the noise in the reference channel is on output lead 96 of ADC 95. The signals on the leads 88, 89, etc., are fed to the first input of the digital summers 80, 81, etc., of a digital summing circuit array 75. The reference channel noise value on lead 96 is fed to the second input of all the digital summers 80, 81, etc., for digital subtraction prior to being output on leads 90, 91, etc.

Thus, in the digital embodiment of the present invention, one digitized reference is subtracted from all the digitized signals, as compared to the analog embodiment in FIG. 2 where one analog reference is subtracted from all the analog signals. The second embodiment of the present invention can be used with a standard off-the-shelf ADC.

Results

Figure 4:
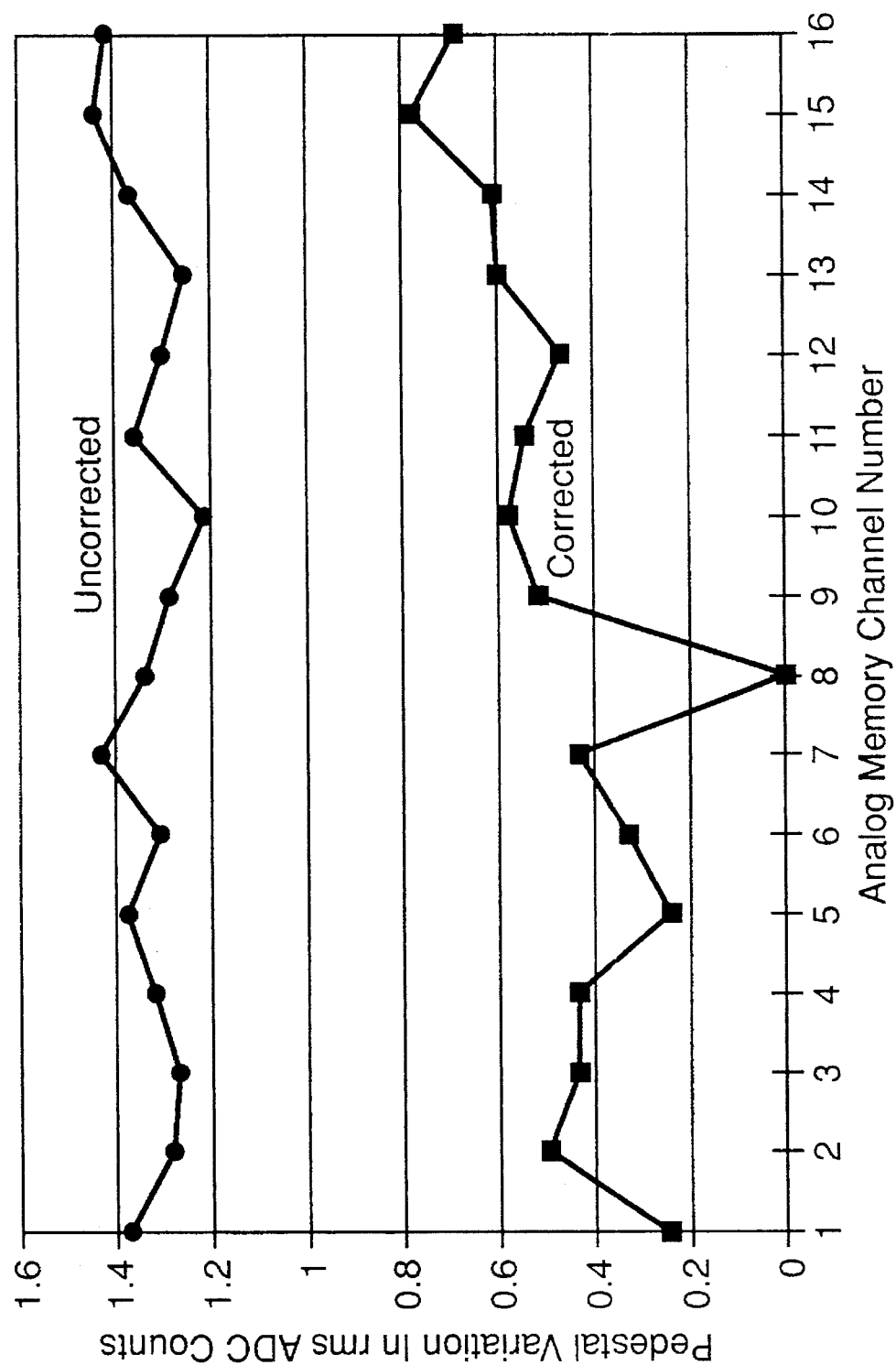
FIG. 4 is a graph of pedestal variation with analog memory channel number in accordance with the analog embodiment of FIG. 2.

FIG. 4 is a graph of pedestal variation with analog memory channel number in accordance with the analog embodiment of FIG. 2. It illustrates the systematic error correction. The top trace labeled 'Uncorrected' shows the standard deviation, in time sequence, about a mean value of the pedestals for each of the cells. The analog memory was sixteen cells deep. It ranges from about 1.2 to 1.4 ADC counts variation. Channel 8 was the reference channel. Channel 8 was subtracted from all channels. All the channels dropped by as much as a factor of seven.

The present invention extends to another application of switched-capacitor analog memory arrays. It is known to use just one ADC and an analog multiplexer to read out many channels of memory. The analog multiplexer multiplexes many channels of memory into one output, and is addressed to read out the data channels sequentially. In the invention, the reference channel is connected to the one ADC. Any channel addressed through the multiplexer goes through the ADC, and the reference channel value on the reference input to the ADC is subtracted from the signal as previously described.

The present invention is thus seen to provide means in the form of a single switched-capacitor analog memory channel to correct a multichannel switched-capacitor analog memory array, not just a single analog memory channel as in the past.

It also provides a new implementation of differential common-mode rejection for switched-capacitor analog memory arrays that improves performance and lowers cost, especially when large numbers of analog memories are used.

While there has been shown and described what are at present considered the preferred embodiments of the invention, it will be obvious to those skilled in the art that various changes and modifications can be made therein without departing from the scope of the inventions defined by the appended claims.

I claim:

1. In a multichannel array of switched-capacitor analog memories wherein each analog memory is connected to an associated analog-to-digital converter, a method of correcting common-mode noise and pedestal noise comprising the steps of:

dividing the analog memories into groups based on the commonality of the group's noise source inputs;

providing a single differential element for each of said groups of analog memories;

generating differential common-mode correction signals in said single differential elements for correcting the noise source inputs of each of said groups of analog memories;

providing digital summing circuits corresponding to each of said analog-to-digital converters, said summing circuits having first and second inputs;

connecting the output leads of each of said analog-to-digital converters to said first inputs of said digital summing circuits; and applying said correction signals to said second inputs of said digital summing circuits.

2. In combination with a switched-capacitor analog memory array having multiple channels of analog memories connected to associated analog-to-digital converters, a system for correcting common-mode noise and pedestal noise comprising:

a single differential element for generating a differential common-mode correction signal, said single differential element having the same noise source inputs as the analog memories, and said differential common-mode correction signal applied to each channel of said switched-capacitor analog memory array.

3. The apparatus of claim 2 wherein said single differential element comprises in combination a reference analog memory connected to a reference analog-to-digital converter together with an array of digital summing circuits associated with each of said channels;

said reference analog memory having the same noise source inputs as the other analog memories;

each of said digital summing circuits connected at one input to an analog-to-digital converter; and said analog-to-digital converter connected for applying said correction signal from said reference analog memory to the other inputs of said digital summing circuits.

* * * * *